(12) United States Patent
Chang et al.

(10) Patent No.: US 10,602,641 B2
(45) Date of Patent: Mar. 24, 2020

(54) HOUSING ASSEMBLY AND ELECTRONIC DEVICE

(71) Applicant: PEGATRON CORPORATION, Taipei (TW)

(72) Inventors: Kai-Ming Chang, Taipei (TW); Chou-Hsiung Chuang, Taipei (TW); Chun-Tang Hsu, Taipei (TW); Yu-Juei Chang, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 16/283,921

(22) Filed: Feb. 25, 2019

(65) Prior Publication Data
US 2019/0335611 A1 Oct. 31, 2019

(30) Foreign Application Priority Data
Apr. 25, 2018 (TW) .............................. 107114077 A

(51) Int. Cl.
*H05K 7/20* (2006.01)
*H01R 13/631* (2006.01)
*H05K 7/14* (2006.01)
*H05K 5/02* (2006.01)

(52) U.S. Cl.
CPC ......... *H05K 7/2039* (2013.01); *H01R 13/631* (2013.01); *H05K 5/0217* (2013.01); *H05K 7/14* (2013.01)

(58) Field of Classification Search
CPC ...... H05K 7/2039; H05K 5/0217; H05K 7/14; H05K 7/20418; H05K 7/20509; H05K 7/1404; H05K 1/0203; H05K 7/2049; H05K 9/0058; H05K 7/20409; H05K 7/20436; H05K 7/20672; H05K 7/20154; H05K 7/20336; H05K 7/20445; H05K 7/20472;
(Continued)

(56) References Cited

U.S. PATENT DOCUMENTS

| | | | | |
|---|---|---|---|---|
| 4,867,235 A | * | 9/1989 | Grapes | H01L 23/3733 165/185 |
| 5,220,485 A | * | 6/1993 | Chakrabarti | H05K 7/1404 165/185 |

(Continued)

FOREIGN PATENT DOCUMENTS

TW M241726 8/2004
TW M326661 2/2008

*Primary Examiner* — Jayprakash N Gandhi
*Assistant Examiner* — Michael A Matey
(74) *Attorney, Agent, or Firm* — McClure, Qualey & Rodack, LLP

(57) ABSTRACT

A housing assembly has an insertion opening adapted for insertion of an electronic unit and includes a first housing, a second housing, a thermal pad, and a guide structure. The second housing is opposite to the first housing, a space is formed between the first housing and the second housing, and the space is in communication with the insertion opening. The thermal pad is disposed on one side of the first housing facing the second housing. The guide structure is disposed inside the space and is adapted to guide the electronic unit to move towards the first housing when the electronic unit is inserted into the space through the insertion opening and moves, so that the electronic unit comes into contact with the thermal pad.

7 Claims, 8 Drawing Sheets

(58) Field of Classification Search
CPC ......... H05K 1/181; H05K 2201/10522; H05K 5/0069; H05K 7/1418; H05K 7/20; H01R 13/631; H01R 13/745; H01R 12/721; H01R 13/633; H01R 13/6658; H01R 9/03; H01R 12/722; H01R 13/50; H01R 24/28; H01R 25/006; H01R 25/14; H01L 23/373; H01L 23/367; H01L 2023/4068; H01L 23/34; G02B 6/4261; G02B 6/4269; G02B 6/4268; G02B 6/4245; G02B 6/4266; G02B 6/4271; F28F 2275/08; G06F 1/1658
See application file for complete search history.

(56) References Cited

U.S. PATENT DOCUMENTS

| | | | | |
|---|---|---|---|---|
| 7,794,241 | B2* | 9/2010 | Bright | H01R 12/721 439/59 |
| 8,870,471 | B2* | 10/2014 | Ito | G02B 6/4277 385/88 |
| 9,052,483 | B2* | 6/2015 | Nguyen | G02B 6/4261 |
| 9,590,356 | B2* | 3/2017 | Joo | H01R 13/6335 |
| 2003/0171016 | A1* | 9/2003 | Bright | G02B 6/4201 439/160 |
| 2009/0296350 | A1* | 12/2009 | Oki | G02B 6/4201 361/709 |
| 2013/0034992 | A1* | 2/2013 | Phillips | H01R 13/6581 439/527 |
| 2014/0098497 | A1* | 4/2014 | Henry | H04L 12/6418 361/709 |
| 2016/0100505 | A1* | 4/2016 | Reid | H05K 7/20545 361/714 |
| 2016/0174415 | A1* | 6/2016 | Ito | G02B 6/42 361/715 |
| 2017/0027083 | A1* | 1/2017 | Bai | H05K 7/20509 |
| 2018/0131128 | A1* | 5/2018 | Franz | H01R 13/5219 |
| 2018/0164519 | A1* | 6/2018 | Takai | H01R 12/714 |

* cited by examiner

HOUSING ASSEMBLY AND ELECTRONIC DEVICE

RELATED APPLICATIONS

This application claims priority to Taiwan Application Serial Number 107114077, filed Apr. 25, 2018, which is herein incorporated by reference in its entirety.

BACKGROUND

Technical Field

The present disclosure relates to a housing assembly and an electronic device.

Related Art

When an electronic element (such as a solid-state drive) uses a thermally conductive device or a heat dissipation device to assist heat dissipation, a thermal pad is generally used, so that the electronic element comes into close contact with the thermally conductive device or the heat dissipation device through the thermal pad to improve heat dissipation efficiency.

For a pluggably removable electronic element, if the electronic element is in close contact with the thermal pad, a frictional resistance can cause a difficulty in insertion of the electronic element into a housing or pulling-out of the electronic element from a housing, and may even cause damage to the thermal pad. In the absence of an assistance of the thermally conductive device or the heat dissipation device, the removable electronic element may have an overheat problem.

SUMMARY

In view of this, an objective of the present disclosure is to provide a housing assembly that can assist a removable electronic element to be in close contact with a thermal pad and avoid a damage caused to the thermal pad due to insertion and pulling-out of the electronic element.

According to some embodiments of the present disclosure, a housing assembly has an insertion opening adapted for insertion of an electronic unit and includes a first housing, a second housing, a thermal pad, and a guide structure. The second housing is opposite to the first housing, a space is formed between the first housing and the second housing, and the space is in communication with the insertion opening. The thermal pad is disposed on one side of the first housing facing the second housing. The guide structure is disposed inside the space and is adapted to guide the electronic unit to move towards the first housing when the electronic unit is inserted into the space through the insertion opening and moves, so that the electronic unit comes into contact with the thermal pad.

In one or more embodiments of the present disclosure, the guide structure is a boss. The boss is disposed on one side of the second housing facing the first housing and has a chamfer, and the chamfer is located on one side of the boss adjacent to the insertion opening. A distance from one end of the chamfer adjacent to the insertion opening to the first housing is greater than a distance from one end of the chamfer away from the insertion opening to the first housing.

In one or more embodiments of the present disclosure, the electronic unit includes a protrusion, and the protrusion slidably abuts against the boss. When the protrusion moves from the end of the chamfer adjacent to the insertion opening towards the end of the chamfer away from the insertion opening under the guidance of the chamfer, the electronic unit moves towards the first housing to come into contact with the thermal pad.

In one or more embodiments of the present disclosure, the guide structure is a chute structure, and the chute structure includes a lifting guide portion. A distance from one end of the lifting guide portion adjacent to the insertion opening to the first housing is greater than a distance from one end of the lifting guide portion away from the insertion opening to the first housing.

In one or more embodiments of the present disclosure, the chute structure further includes a horizontal guide portion. The horizontal guide portion is connected to the lifting guide portion, and the lifting guide portion is located between the insertion opening and the horizontal guide portion.

In one or more embodiments of the present disclosure, the electronic unit includes a guide post, and the guide post is slidably located in the chute structure. When the guide post moves from the end of the lifting guide portion adjacent to the insertion opening towards the end of the lifting guide portion away from the insertion opening under the guidance of the lifting guide portion, the electronic unit moves towards the first housing to come into contact with the thermal pad.

In one or more embodiments of the present disclosure, the housing assembly further includes a heat-conducting pipe in contact with the thermal pad.

According to some embodiments, an electronic device includes a housing assembly, an electric connector, and an electronic unit. The housing assembly has an insertion opening, and includes a first housing, a second housing, a thermal pad, and a guide structure. The second housing is opposite to the first housing, a space is formed between the first housing and the second housing, and the space is in communication with the insertion opening. The thermal pad is disposed on one side of the first housing facing the second housing. The guide structure is disposed inside the space. The electric connector is disposed inside the space and has a socket, and the guide structure is located between the insertion opening and the socket. The electronic unit is pluggably connected to the socket. When the electronic unit is inserted into the space through the insertion opening and moves towards the socket, the guide structure guides the electronic unit to move towards the first housing, so that the electronic unit comes into contact with the thermal pad.

In one or more embodiments of the present disclosure, the guide structure is a boss. The boss is disposed on one side of the second housing facing the first housing and has a chamfer. The chamfer is located on one side of the boss adjacent to the insertion opening. A distance from one end of the chamfer adjacent to the insertion opening to the first housing is greater than a distance from one end of the chamfer away from the insertion opening to the first housing.

In one or more embodiments of the present disclosure, the electronic unit includes a protrusion, and the protrusion slidably abuts against the boss. When the protrusion moves from the end of the chamfer adjacent to the insertion opening towards the end of the chamfer away from the insertion opening under the guidance of the chamfer, the electronic unit moves towards the first housing to come into contact with the thermal pad.

In one or more embodiments of the present disclosure, the guide structure is a chute structure, and the chute structure includes a lifting guide portion. A distance from one end of the lifting guide portion adjacent to the insertion opening to the first housing is greater than a distance from one end of the lifting guide portion away from the insertion opening to the first housing.

In one or more embodiments of the present disclosure, the chute structure further includes a horizontal guide portion. The horizontal guide portion is connected to the lifting guide portion, and the lifting guide portion is located between the insertion opening and the horizontal guide portion.

In one or more embodiments of the present disclosure, the electronic unit includes a guide post, and the guide post is slidably located in the chute structure. When the guide post moves from the end of the lifting guide portion adjacent to the insertion opening towards the end of the lifting guide portion away from the insertion opening under the guidance of the lifting guide portion, the electronic unit moves towards the first housing to come into contact with the thermal pad.

In conclusion, the housing assembly of the present disclosure resolves the difficulty of matching a removable electronic element with a thermally conductive device or a heat dissipation device. In the process of mounting the electronic element, the housing assembly of the present disclosure lifts the electronic element upward by using the guide structure, so that the electronic element can be closely attached to the thermal pad to achieve a good heat dissipation effect.

DETAILED DESCRIPTION

Figure 1:
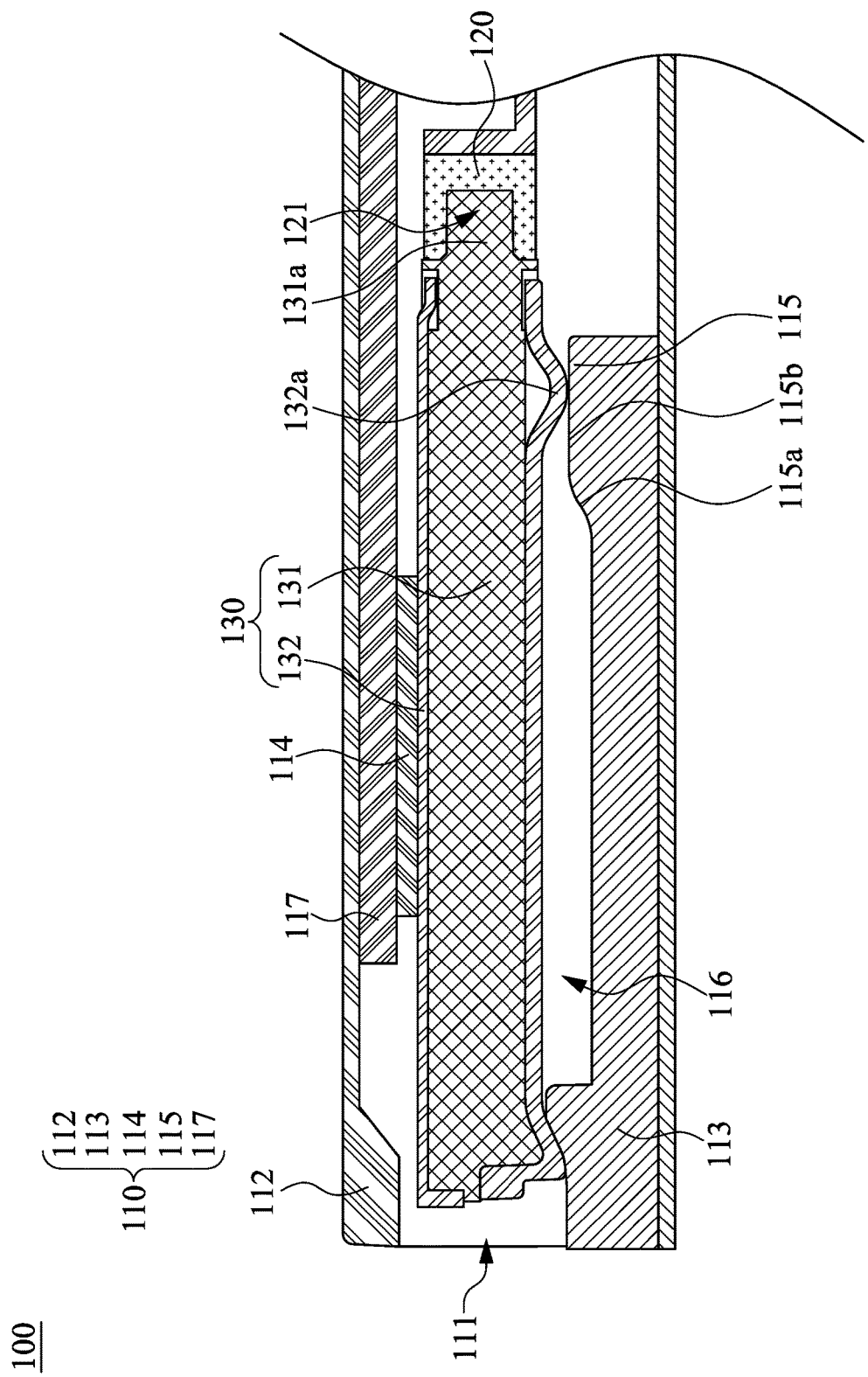
FIG. 1 is a cross-sectional view of an electronic device illustrated according to an embodiment of the present disclosure.

A plurality of embodiments of the present invention is disclosed below in the drawings, in which components are not drawn in scale, and are provided merely to illustrate the present invention. Any practical details are described below to provide a thorough understanding of the present invention. However, persons of ordinary skill in the art should understand that the present invention may be practiced without one or more specific details. Therefore, these details should not be used to limit the present invention.

FIG. 1 is a cross-sectional view of an electronic device 100 illustrated according to an embodiment of the present disclosure. The electronic device 100 includes a housing assembly 110, an electric connector 120, and an electronic unit 130. The housing assembly 110 has an insertion opening 111, and the electronic unit 130 is inserted into the housing assembly 110, or pulled out of the housing assembly 110 through the insertion opening 111. The housing assembly 110 further includes a first housing 112, a second housing 113, a thermal pad 114, and a guide structure 115. The second housing 113 is opposite to the first housing 112, a space 116 is formed between the first housing 112 and the second housing 113, and the space 116 is in communication with the insertion opening 111. The thermal pad 114 is disposed on one side of the first housing 112 facing the second housing 113, and the guide structure 115 is disposed inside the space 116.

The electric connector 120 is disposed inside the space 116 and has a socket 121 facing the insertion opening 111, and the guide structure 115 is located between the insertion opening 111 and the socket 121. The electronic unit 130 is pluggably connected to the socket 121. When the electronic unit 130 is connected to the socket 121, the electronic unit 130 comes into close contact with the thermal pad 114, so that heat generated by the electronic unit 130 is effectively conducted to the first housing 112, and the heat is dissipated by means of a large surface area of the first housing 112.

During a period when the electronic unit 130 is inserted into the space 116 through the insertion opening 111 and moves towards the socket 121, the guide structure 115 is adapted to guide the electronic unit 130 to move towards the first housing 112 and come into contact with the thermal pad 114. On the contrary, during a period when the electronic unit 130 is separated from the socket 121 and moves towards the insertion opening 111, the guide structure 115 is adapted to guide the electronic unit 130 to move towards the second housing 113 away from the thermal pad 114.

In some embodiments, the electronic unit 130 includes an electronic element 131 and a cover body 132. The electronic element 131 is partially accommodated inside the cover body 132 and has a connector 131a which protrudes out of the cover body 132. When the connector 131a of the electronic unit 130 is connected to the socket 121, the cover body 132 comes into contact with the thermal pad 114.

As shown in FIG. 1, in some embodiments, the guide structure 115 is a boss. The boss is disposed on one side of the second housing 113 facing the first housing 112 and has a chamfer 115a and a bench 115b connected thereto. The chamfer 115a is located on one side of the boss adjacent to the insertion opening 111, and one end of the chamfer 115a away from the insertion opening 111 is connected to the bench 115b. A distance from one end of the chamfer 115a adjacent to the insertion opening 111 to the first housing 112 is greater than a distance from the one end of the chamfer 115a away from the insertion opening 111 to the first housing 112. The cover body 132 has a protrusion 132a facing the second housing 113 and the protrusion 132a slidably abuts against the boss. The protrusion 132a slides along the chamfer 115a to adjust a distance between the electronic unit 130 and the first housing 112, and the protrusion 132a slides along the bench 115b such that the connector 131a of the electronic element 131 is horizontally inserted into or withdrawn from the socket 121.

Figure 2A:
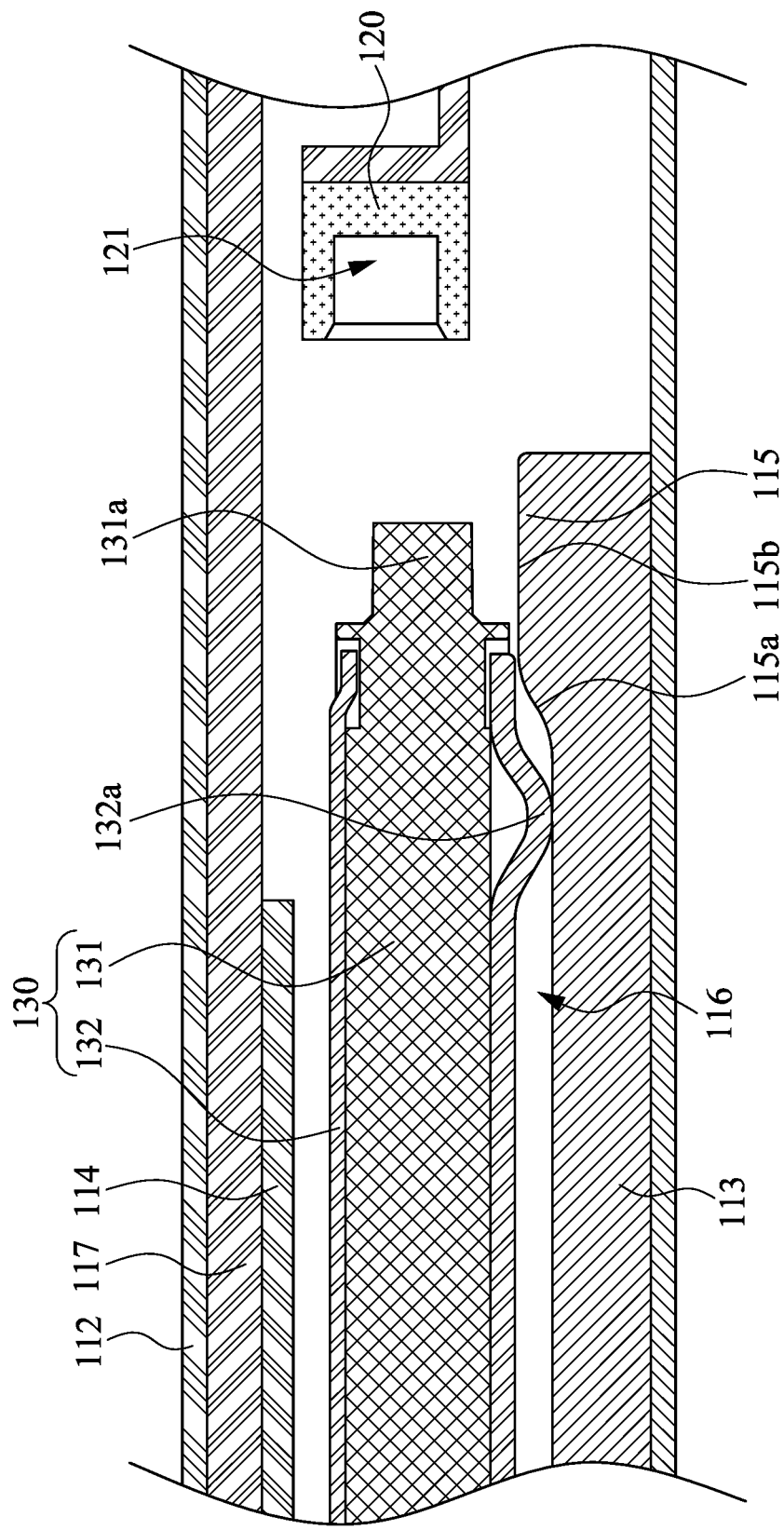
FIG. 2A to 2C are cross-sectional views of different stages of a process of mounting an electronic unit on the electronic device illustrated in FIG. 1.
Figure 2B:
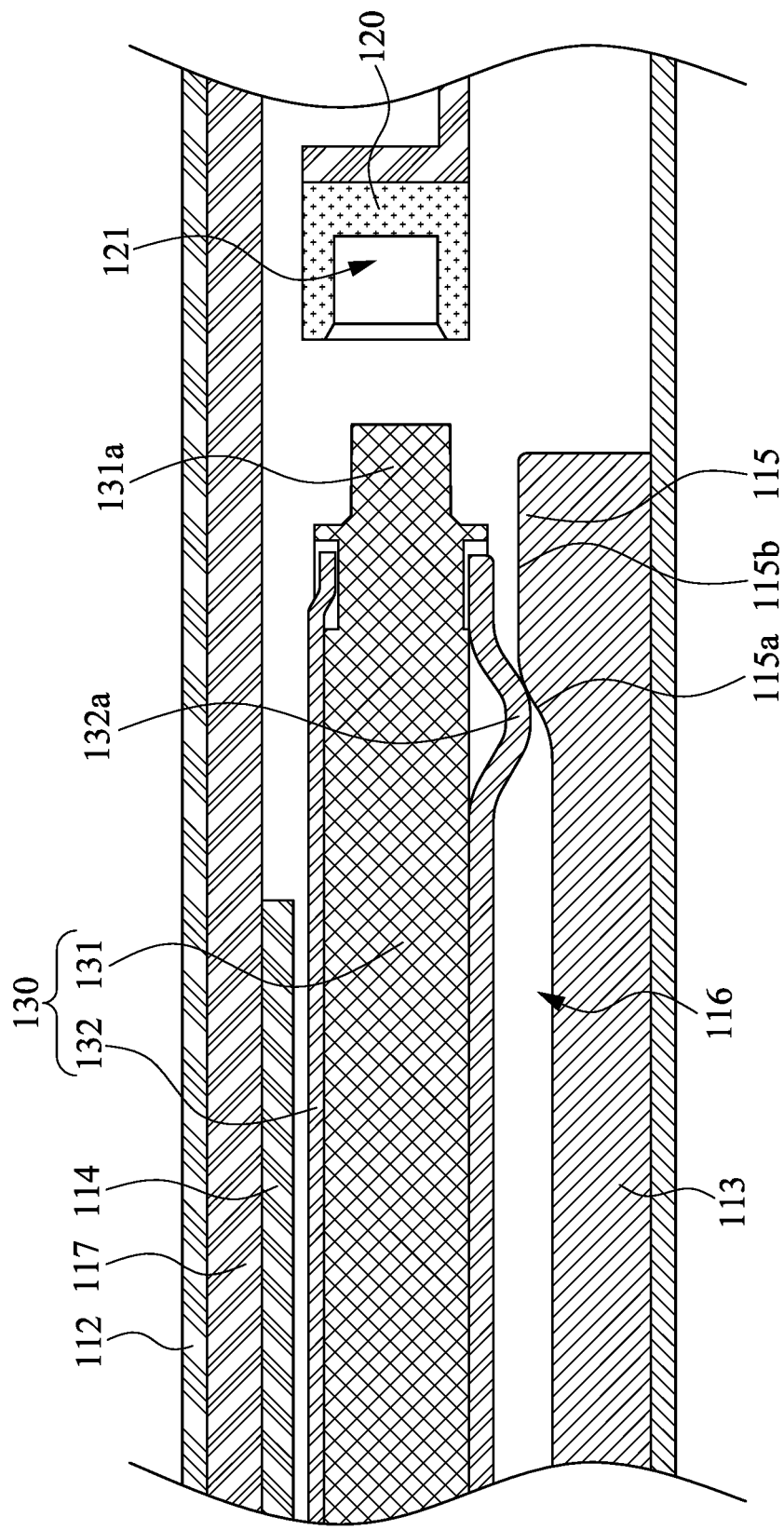
Figure 2C:
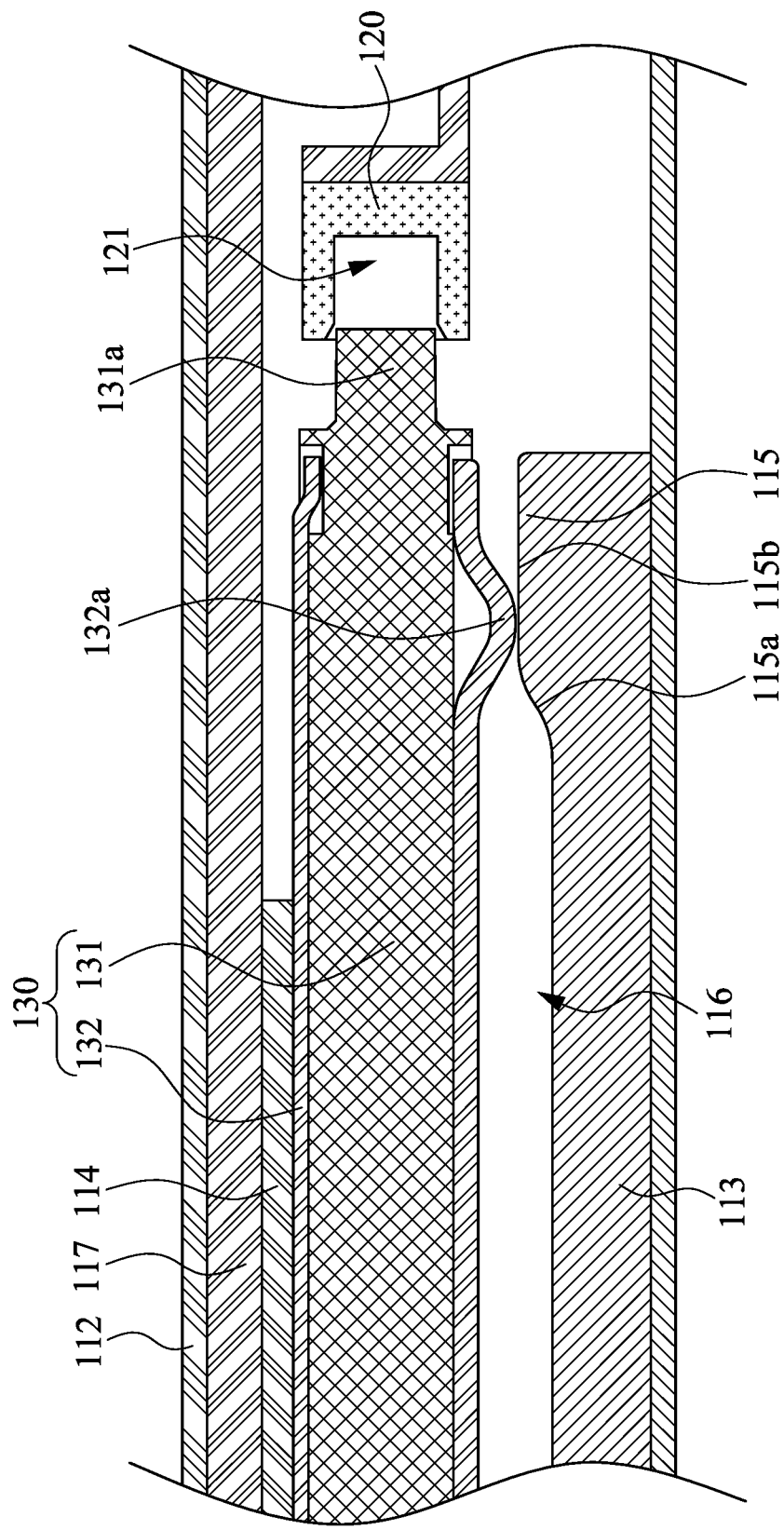

FIG. 2A to 2C are cross-sectional views of different stages of a process of mounting an electronic unit 130 on the electronic device 100 illustrated in FIG. 1. During a period of mounting the electronic unit 130, the electronic unit 130 enters the space 116 from the insertion opening 111 and moves towards the socket 121. As shown in FIG. 2A, the protrusion 132a of the cover body 132 first slides along the second housing 113 away from the insertion opening 111. Then, as shown in FIG. 2B, the protrusion 132a slides along the chamfer 115a of the boss towards one end of the chamfer 115a away from the insertion opening 111, and guides the electronic unit 130 to move towards the first housing 112, so that the connector 131a of the electronic element 131 is aligned with the socket 121 in height, and the cover body 132 is closely attached to the thermal pad 114. Finally, as shown in FIG. 2C, the protrusion 132a moves along the bench 115b of the boss towards the socket 121 to assist the connector 131a to be horizontally inserted into the socket 121, so that the electronic element 131 and the electric connector 120 are firmly electrically connected to each other to complete mounting of the electronic unit 130.

On the contrary, during a period of pulling the housing assembly 110 out of the electronic unit 130, as shown in FIG. 2C, the protrusion 132a of the cover body 132 first moves along the bench 115b of the boss towards the insertion opening 111, so that the connector 131a is horizontally withdrawn from the socket 121. Then, as shown in FIG. 2B, the protrusion 132a slides along the chamfer 115a of the boss towards an end of the chamfer 115a adjacent to the insertion opening 111, and guides the electronic unit 130 to move towards the second housing 113 away from the thermal pad 114, to prevent the electronic unit 130 from frictionally damaging the thermal pad 114, and allow the electronic unit 130 to smoothly pull out the housing assembly 110 through the insertion opening 111. Finally, as shown in FIG. 2A, the protrusion 132a slides along the second housing 113 towards the insertion opening 111, until the electronic unit 130 is fully withdrawn from the housing assembly 110 and the electronic unit 130 is removed.

It should be noted that when the protrusion 132a slides along the bench 115b, the cover body 132 will rub against the thermal pad 114. Therefore, a length of the bench 115b must be limited to ensure that the connector 131a is horizontally inserted into and pulled out of the socket 121, and at the same time, the thermal pad 114 is prevented from being damaged by excessive friction.

Figure 3:
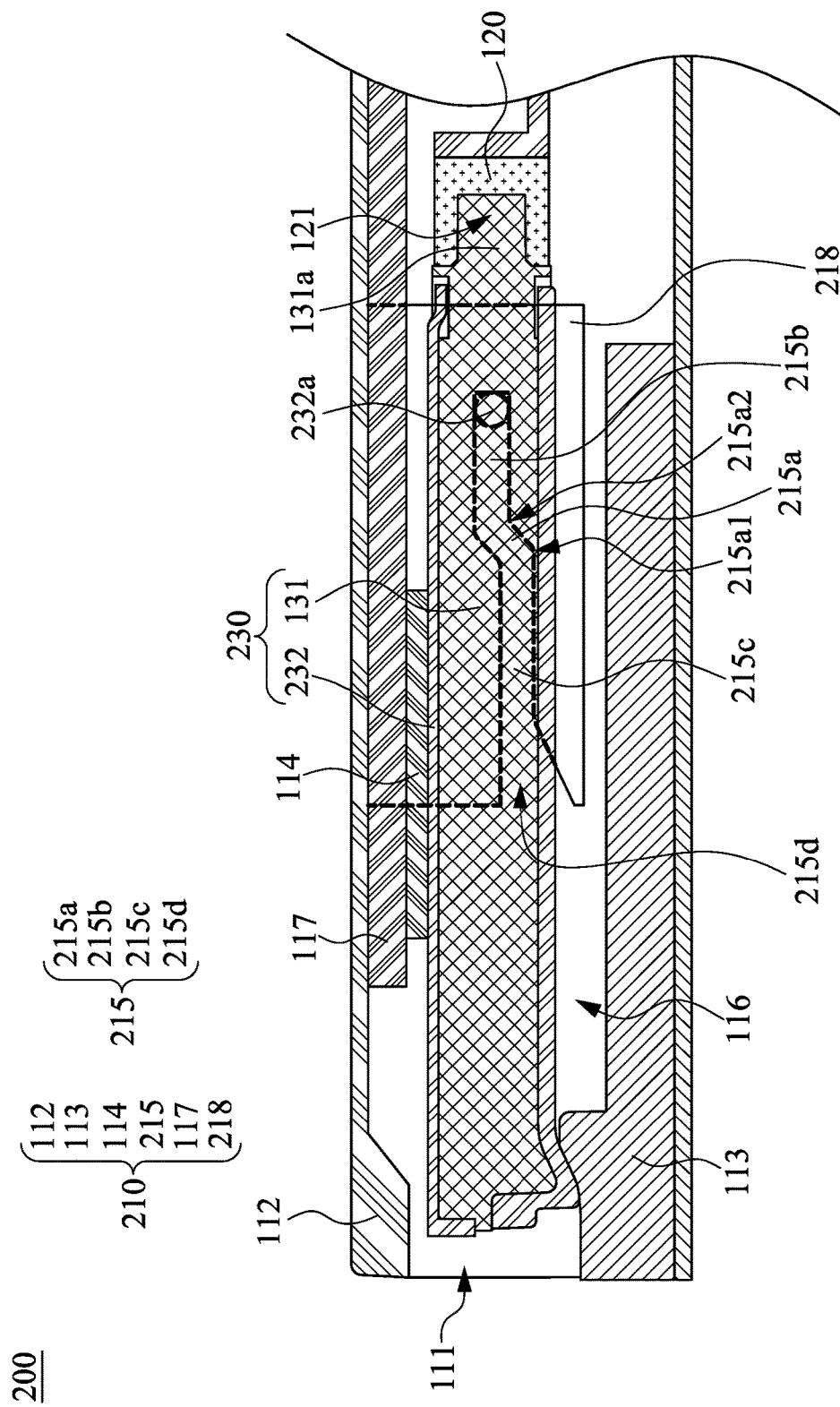
FIG. 3 is a cross-sectional view of an electronic device illustrated according to another embodiment of the present disclosure.

FIG. 3 is a cross-sectional view of an electronic device 200 illustrated according to another embodiment of the present disclosure. The electronic device 200 includes a housing assembly 210, an electric connector 120, and an electronic unit 230. The housing assembly 210 has an insertion opening 111, and includes a first housing 112, a second housing 113, a thermal pad 114, a guide structure 215 and a bracket 218. The electronic unit 230 includes an electronic element 131 and a cover body 232. The insertion opening 111, the first housing 112, the second housing 113, the thermal pad 114, the electronic element 131 and the electric connector 120 are the same as that in the embodiments shown in FIG. 1, and therefore, references can be made to the above description, and details are not described herein again.

It should be noted that one difference between this embodiment and the embodiment shown in FIG. 1 is that the housing assembly 210 of this embodiment further includes a bracket 218 (partially shown in dotted line in FIG. 3) connected to the first housing 112, and a guide structure 215 (shown in dotted line in FIG. 3) of the housing assembly 210 is a chute structure, and the guide structure 215 is disposed on the bracket 218. In addition, another difference between this embodiment and the embodiment shown in FIG. 1 is that the cover body 232 of this embodiment includes a guide post 232a (shown in dotted line in FIG. 3) slidably located in the chute structure.

It should be understood that the bracket 218 is connected to the first housing 112 is shown in FIG. 3, but the present disclosure is not limited thereto. In some embodiments, the bracket 218 may be connected to the second housing 113. In some embodiments, the housing assembly 210 may not include the bracket 218, and the chute structure may be directly disposed on a side housing of the housing assembly 210 for connecting the first housing 112 to the second housing 113.

In some embodiments, the chute structure includes a lifting guide portion 215a and a horizontal guide portion 215b that are connected. The lifting guide portion 215a is located between the insertion opening 111 and the horizontal guide portion 215b, and has a first end 215a1 away from the horizontal guide portion 215b and a second end 215a2 connected to the horizontal guide portion 215b. A distance from the first end 215a1 to the first housing 112 is greater than a distance from the second end 215a2 to the first housing 112. The guide post 232a slides along the lifting guide portion 215a to adjust a distance between the electronic unit 230 and the first housing 112, and the guide post 232a slides along the horizontal guide portion 215b such that the connector 131a of the electronic element 131 is horizontally inserted into or withdrawn from the socket 121.

In some embodiments, the chute structure further includes a third guide portion 215c connected to the lifting guide portion 215a, and has a chute inlet 215d through which the guide post 232a enters or leaves the chute structure. In some embodiments, a width of the chute inlet 215d is greater than widths of the lifting guide portion 215a, the horizontal guide portion 215b and the third guide portion 215c, to facilitate the guide post 232a to enter the chute structure.

Figure 4A:
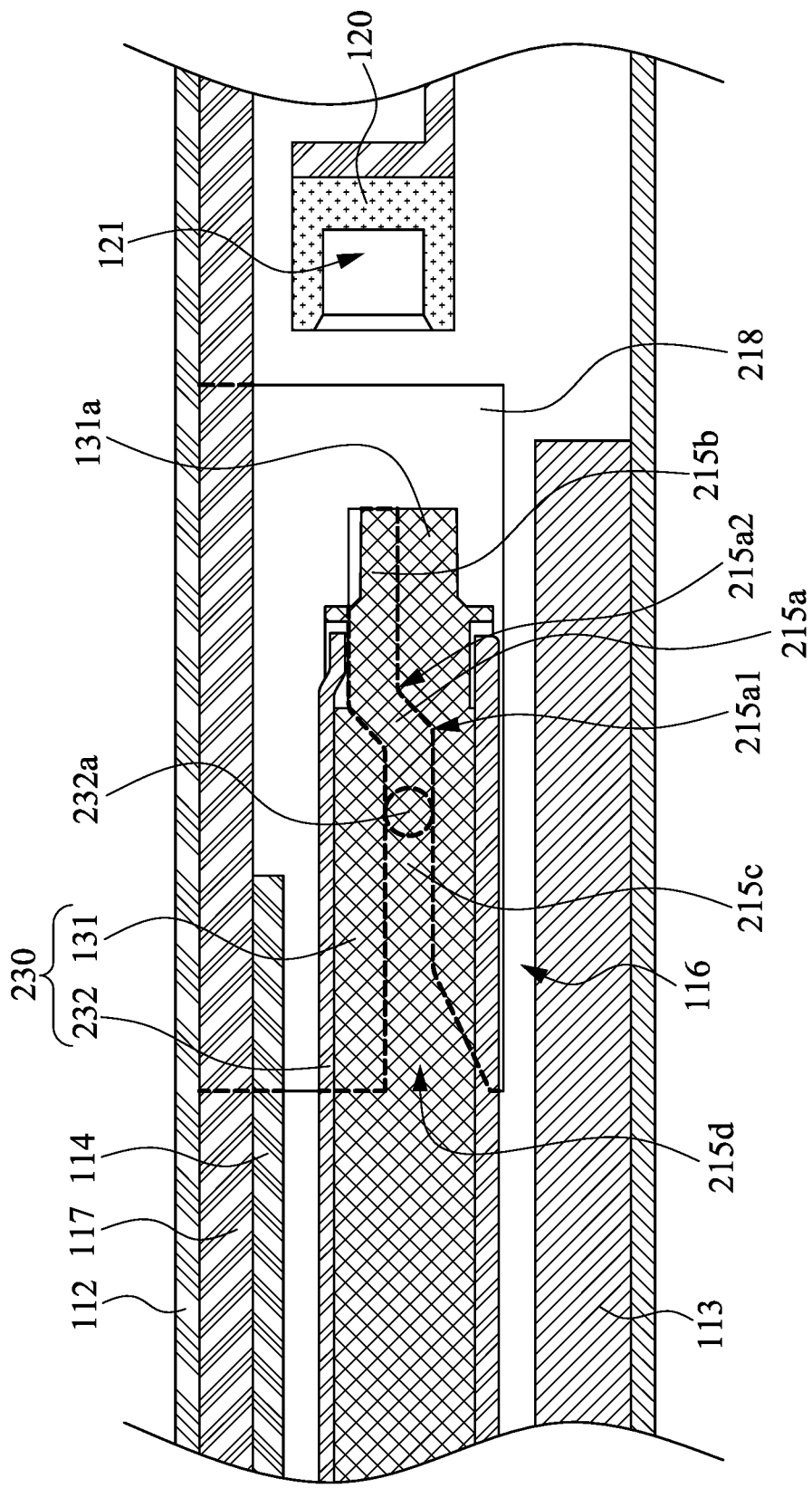
FIG. 4A to 4C are cross-sectional views of different stages of a process of mounting an electronic unit on the electronic device illustrated in FIG. 3.
Figure 4B:
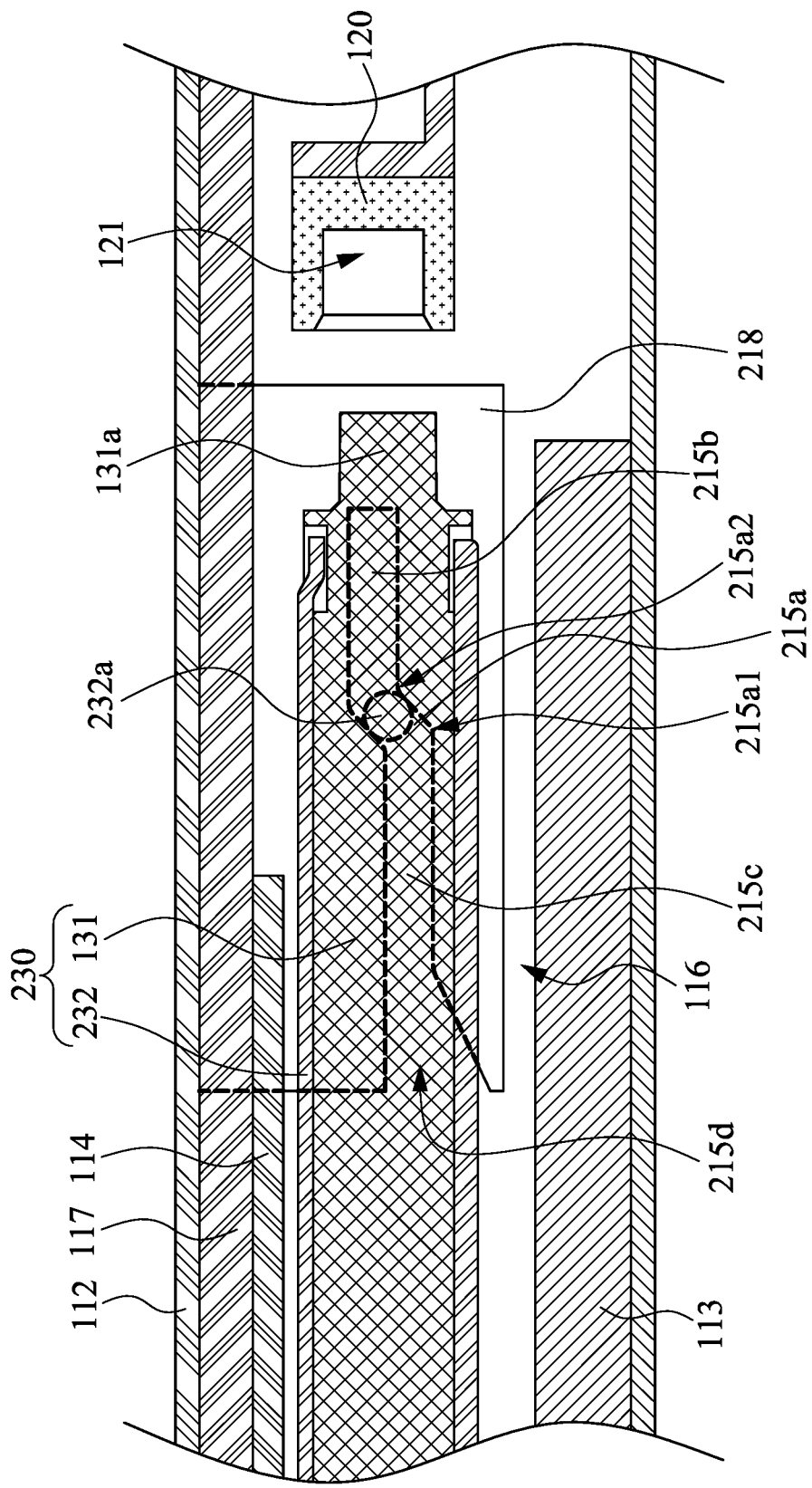
Figure 4C:
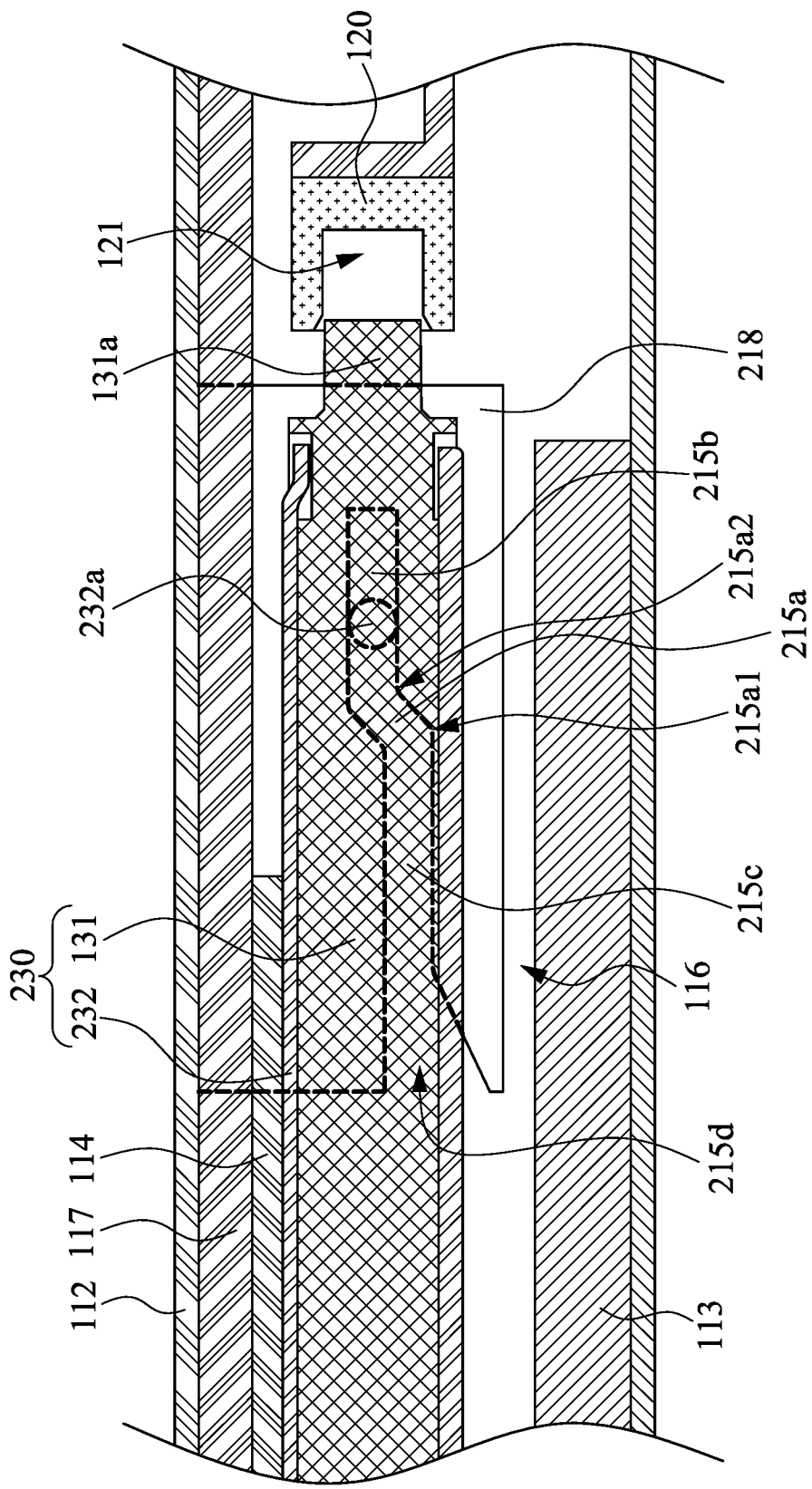

FIG. 4A to 4C are cross-sectional views of different stages of a process of mounting an electronic unit 230 on the electronic device 200 illustrated in FIG. 3. During a period of mounting the electronic unit 230, the electronic unit 230 enters the space 116 from the insertion opening 111 and moves towards the socket 121. As shown in FIG. 4A, the guide post 232a of the cover body 232 first passes through the chute inlet 215d and slides along the third guide portion 215c away from the insertion opening 111. Then, as shown in FIG. 4B, the guide post 232a slides along the lifting guide portion 215a towards the second end 215a2, and guides the electronic unit 230 to move towards the first housing 112, so that the connector 131a of the electronic element 131 is aligned with the socket 121 in height, and the cover body 232 is closely attached to the thermal pad 114. Finally, as shown in FIG. 4C, the guide post 232a moves along the horizontal guide portion 215b towards the socket 121 to assist the connector 131a to be horizontally inserted into the socket 121, so that the electronic element 131 and the electric connector 120 are firmly electrically connected to each other to complete mounting of the electronic unit 230.

On the contrary, during a period of pulling the housing assembly 110 out of the electronic unit 230, as shown in FIG. 4C, the guide post 232a of the cover body 232 first moves along horizontal guide portion 215b towards the insertion opening 111, so that the connector 131a is horizontally withdrawn from the socket 121. Then, as shown in FIG. 4B, the guide post 232a slides along the lifting guide portion 215a towards the first end 215a1, and guides the electronic unit 230 to move towards the second housing 113 away from the thermal pad 114, to prevent the electronic unit 230 from frictionally damaging the thermal pad 114, and allow the electronic unit 230 to smoothly pull out the housing assembly 210 through the insertion opening 111. Finally, as shown in FIG. 4A, the guide post 232a slides along the third guide portion 215c towards the insertion opening 111, until the guide post 232a passes through the chute inlet 215d and the electronic unit 230 is fully withdrawn from the housing assembly 210 and the electronic unit 230 is removed.

It should be noted that when the guide post 232a slides along the horizontal guide portion 215b, the cover body 232 will rub against the thermal pad 114. Therefore, a length of the horizontal guide portion 215b must be limited to ensure that the connector 131a is horizontally inserted into and pulled out of the socket 121, and at the same time, the thermal pad 114 is prevented from being damaged by excessive friction.

In some embodiments, the housing assemblies 110 and 210 further include a heat-conducting pipe 117 in contact with the thermal pad 114. The heat-conducting pipe 117 can make the heat generated by the electronic unit 130 and 230 quickly leave away from a guidance of the heat-conducting pipe 117, thereby further improving the heat dissipation efficiency.

In conclusion, the housing assembly of the present disclosure resolves the difficulty of matching a removable electronic element with a thermally conductive device or a heat dissipation device. In the process of mounting the electronic element, the housing assembly of the present disclosure lifts the electronic element upward by using the guide structure, so that the electronic element can be closely attached to the thermal pad to achieve a good heat dissipation effect.

Although various embodiments of the present invention have been disclosed above, it should be understood that is the embodiments are only an example, not a limitation. Any variation and modification can be made without departing from the spirit and scope of the present invention. Therefore, the protection scope of the present invention should be subject to the scope defined by the claims.

What is claimed is:

1. A housing assembly, having an insertion opening adapted for insertion of an electronic unit, and comprising:
   a first housing;
   a second housing, opposite to the first housing, wherein a space is formed between the first housing and the second housing, and the space is in communication with the insertion opening;
   a thermal pad, disposed on one side of the first housing facing the second housing; and
   a guide structure, disposed inside the space, wherein the guide structure is a boss, the electronic unit comprises a protrusion, the protrusion slidably abuts against the boss, and the boss is adapted to guide the protrusion to make the electronic unit move towards the first housing when the electronic unit is inserted into the space through the insertion opening and moves, so that the electronic unit comes into contact with the thermal pad.

2. The housing assembly according to claim 1, wherein the boss is disposed on one side of the second housing facing the first housing and has a chamfer, the chamfer is located on one side of the boss adjacent to the insertion opening, and a distance from one end of the chamfer adjacent to the insertion opening to the first housing is greater than a distance from one end of the chamfer away from the insertion opening to the first housing.

3. The housing assembly according to claim 2, wherein when the protrusion moves from the end of the chamfer adjacent to the insertion opening towards the end of the chamfer away from the insertion opening under the guidance of the chamfer, the electronic unit moves towards the first housing to come into contact with the thermal pad.

4. The housing assembly according to claim 1, further comprising a heat-conducting pipe in contact with the thermal pad.

5. An electronic device, comprising:
   a housing assembly, having an insertion opening, and comprising:
   a first housing;
   a second housing, opposite to the first housing, wherein a space is formed between the first housing and the second housing, and the space is in communication with the insertion opening;
   a thermal pad, disposed on one side of the first housing facing the second housing; and
   a guide structure, disposed inside the space, wherein the guide structure is a boss;
   an electric connector, disposed inside the space and having a socket, wherein the guide structure is located between the insertion opening and the socket; and
   an electronic unit, pluggably connected to the socket and comprising a protrusion, wherein the protrusion slidably abuts against the boss, when the electronic unit is inserted into the space through the insertion opening and moves towards the socket, the boss guides the protrusion to make the electronic unit move towards the first housing, so that the electronic unit comes into contact with the thermal pad.

6. The electronic device according to claim 5, wherein the boss is disposed on one side of the second housing facing the first housing and has a chamfer, the chamfer is located on one side of the boss adjacent to the insertion opening, and a distance from one end of the chamfer adjacent to the insertion opening to the first housing is greater than a distance from one end of the chamfer away from the insertion opening to the first housing.

7. The electronic device according to claim 6, wherein when the protrusion moves from the end of the chamfer adjacent to the insertion opening towards the end of the chamfer away from the insertion opening under the guidance of the chamfer, the electronic unit moves towards the first housing to come into contact with the thermal pad.

* * * * *